US008232756B2

(12) United States Patent
Yoshihara et al.

(10) Patent No.: US 8,232,756 B2
(45) Date of Patent: Jul. 31, 2012

(54) MOTOR CONTROL APPARATUS

(75) Inventors: Shigeyuki Yoshihara, Hitachinaka (JP); Hirokazu Matsui, Hitachiohta (JP); Kohei Myoen, Hitachinaka (JP); Toshisada Mitsui, Matsumoto (JP)

(73) Assignee: Hitachi, Ltd., Tokyo (JP)

( * ) Notice: Subject to any disclaimer, the term of this patent is extended or adjusted under 35 U.S.C. 154(b) by 682 days.

(21) Appl. No.: 12/271,444

(22) Filed: Nov. 14, 2008

(65) Prior Publication Data
US 2009/0133947 A1 May 28, 2009

(30) Foreign Application Priority Data
Nov. 22, 2007 (JP) ................................. 2007-303139

(51) Int. Cl.
*H02P 7/00* (2006.01)
(52) U.S. Cl. ......... 318/434; 318/430; 318/716; 318/717
(58) Field of Classification Search .................. 318/700, 318/400.01, 716, 717, 430, 434; 324/500, 324/512, 522
See application file for complete search history.

(56) References Cited

U.S. PATENT DOCUMENTS

| 6,593,714 | B2 * | 7/2003 | Nagayama | 318/400.07 |
|---|---|---|---|---|
| 6,700,343 | B2 * | 3/2004 | Masaki et al. | 318/434 |
| 6,906,492 | B2 * | 6/2005 | Matsushita | 318/727 |
| 6,989,641 | B2 * | 1/2006 | Schulz et al. | 318/139 |
| 7,091,684 | B2 * | 8/2006 | Kobayashi et al. | 318/432 |
| 7,199,538 | B2 * | 4/2007 | Kameya | 318/400.05 |
| 7,450,355 | B2 * | 11/2008 | Ochiai | 361/31 |
| 7,967,572 | B2 * | 6/2011 | Ishikawa et al. | 417/18 |
| 7,990,093 | B2 * | 8/2011 | Kezobo et al. | 318/432 |
| 2002/0008492 | A1 | 1/2002 | Nagayama | |
| 2004/0239272 | A1 | 12/2004 | Schulz et al. | |

FOREIGN PATENT DOCUMENTS

| DE | 101 00 565 A1 | 7/2002 |
|---|---|---|
| JP | 06253585 A * | 9/1994 |
| JP | 07-177602 A | 7/1995 |
| JP | 2000-116176 A | 4/2000 |
| JP | 2000116176 A * | 4/2000 |
| JP | 2002-238299 A | 8/2002 |
| JP | 2004-236371 A | 8/2004 |
| JP | 2005-160136 A | 6/2005 |

OTHER PUBLICATIONS

Extended European Search Report dated Mar. 24, 2009 (Five (5) pages).
Japanese Office Action dated Dec. 6, 2011.

* cited by examiner

*Primary Examiner* — Walter Benson
*Assistant Examiner* — Thai Dinh
(74) *Attorney, Agent, or Firm* — Crowell & Moring LLP

(57) ABSTRACT

An object of the present invention is to provide a motor control apparatus that can perform an abnormality diagnosis of current sensors and achieve cost reduction. When the outputs from three current sensors, which detect individual phase currents of a 3-phase AC current supplied from an inverter to a 3-phase AC motor, indicate that the sum of the individual phase currents of the 3-phase AC current is greater than a predetermined value, a sensor abnormality judgment unit of a motor control unit judges that one of the three current sensors is abnormal. The sensor abnormality judgment unit identifies an abnormal current sensor, which is one of the three current sensors, and performs calculations in accordance with the remaining two normal current sensors to output the current in the phase detected by the abnormal current sensor.

3 Claims, 8 Drawing Sheets

MOTOR CONTROL APPARATUS

BACKGROUND OF THE INVENTION

1. Field of the Invention

The present invention relates to a motor control apparatus, and more particularly to a motor control apparatus suitable for controlling an AC motor by using a current sensor.

2. Description of the Related Art

Hybrid vehicles and electric vehicles, which have an electric motor for their drive unit, are recently highlighted as environmentally-friendly automobiles. Some hybrid vehicles are already commercialized. In general, hybrid vehicles have a wheel-drive AC motor whose drive is controlled by an inverter. It is demanded that the AC motor responsively generate a desired torque, which changes in accordance with a driver's request. A current sensor for detecting an AC current supplied to the motor is used when the inverter controls the AC motor.

As for the AC motor mounted in a hybrid vehicle, therefore, a current value measured by a current sensor is basically used to control the inverter. At least two current sensors are required.

In consideration for a current sensor failure, however, the invention disclosed, for instance, in JP-A-2005-160136 uses a total of four current sensors (two current sensors per phase) and compares the outputs from the individual phase current sensors to check for a current sensor abnormality.

SUMMARY OF THE INVENTION

However, the invention disclosed in JP-A-2005-160136 requires the use of a total of four current sensors for normal inverter control, thereby entailing an increased cost.

An object of the present invention is to provide a motor control apparatus that can perform an abnormality diagnosis of current sensors and achieve cost reduction.

1) In accomplishing the above object, according to one aspect of the present invention, there is provided a motor control apparatus for providing drive control of a 3-phase AC motor, the motor control apparatus comprises sensor abnormality judgment means judges abnormal three current sensors that detect individual phase currents of a 3-phase AC current supplied from an inverter to the 3-phase AC motor, wherein the sensor abnormality judgment means that one of the three current sensors is abnormal, when the sum of the 3-phase AC current is greater than a predetermined value.

The configuration described above makes it possible to perform an abnormality diagnosis of the current sensors and achieve cost reduction.

2) According to another aspect of the present invention, there is provided the motor control apparatus in the above item 1), wherein the sensor abnormality judgment means identifies an abnormal current sensor, which is one of the three current sensors, and calculates the phase current detected by the abnormal current sensor, based on the output from the remaining two normal current sensors, and outputs it.

3) According to another aspect of the present invention, there is provided the motor control apparatus as described in the above item 2), further comprising torque command value switch means switches from a torque command value to a limited torque command value, and torque abnormality judgment means instructed to switch the torque command value to the torque command value switch means, based on the comparison between an estimated torque which is estimated from DC side power of the inverter, and an actual torque, which is determined from the currents detected by the two normal current sensors and the phase current calculated by the sensor abnormality judgment means, wherein the torque abnormality judgment means instructed to switch the torque command value to the torque command value switch means, when an abnormal current sensor is detected by the sensor abnormality judgment means, and the difference between the estimated torque and the actual torque is smaller than a predetermined value, and the motor control apparatus controls the output torque of the 3-phase AC motor in accordance with the limited torque command value.

4) According to another aspect of the present invention, there is provided the motor control apparatus as described in the above item 3), wherein the torque abnormality judgment unit which, when the difference between an estimated torque, which is estimated from DC side power of the inverter, and an actual torque, which is determined from the currents detected by the two normal current sensors and the phase current calculated by the sensor abnormality judgment unit, is greater than a predetermined value, stops the motor control apparatus's control over the 3-phase AC motor.

5) According to still another aspect of the present invention, there is provided a motor control apparatus for providing drive control of a 3-phase AC motor, the motor control apparatus including: a phase current calculator which calculates one of the individual phase currents of a 3-phase AC current supplied from an inverter to the 3-phase AC motor in accordance with the outputs from two current sensors for detecting AC currents in the remaining two phases of the 3-phase AC current; and an abnormality judgment unit which, when the difference between an estimated torque, which is estimated from DC side power of the inverter, and an actual torque, which is determined from the currents detected by the two current sensors and the phase current calculated by the phase current calculator, is greater than a predetermined value, stops the motor control apparatus's control over the 3-phase AC motor.

The configuration described above makes it possible to perform an abnormality diagnosis of the current sensors and achieve cost reduction.

The present invention makes it possible to perform an abnormality diagnosis of current sensors and achieve cost reduction.

DETAILED DESCRIPTION OF THE PREFERRED EMBODIMENTS

The configuration and operation of a motor control apparatus according to a first embodiment of the present invention will now be described with reference to FIGS. 1 to 5.

First of all, the configuration of a hybrid vehicle in which the motor control apparatus according to the first embodiment is mounted will be described with reference to FIG. 1.

Figure 1:
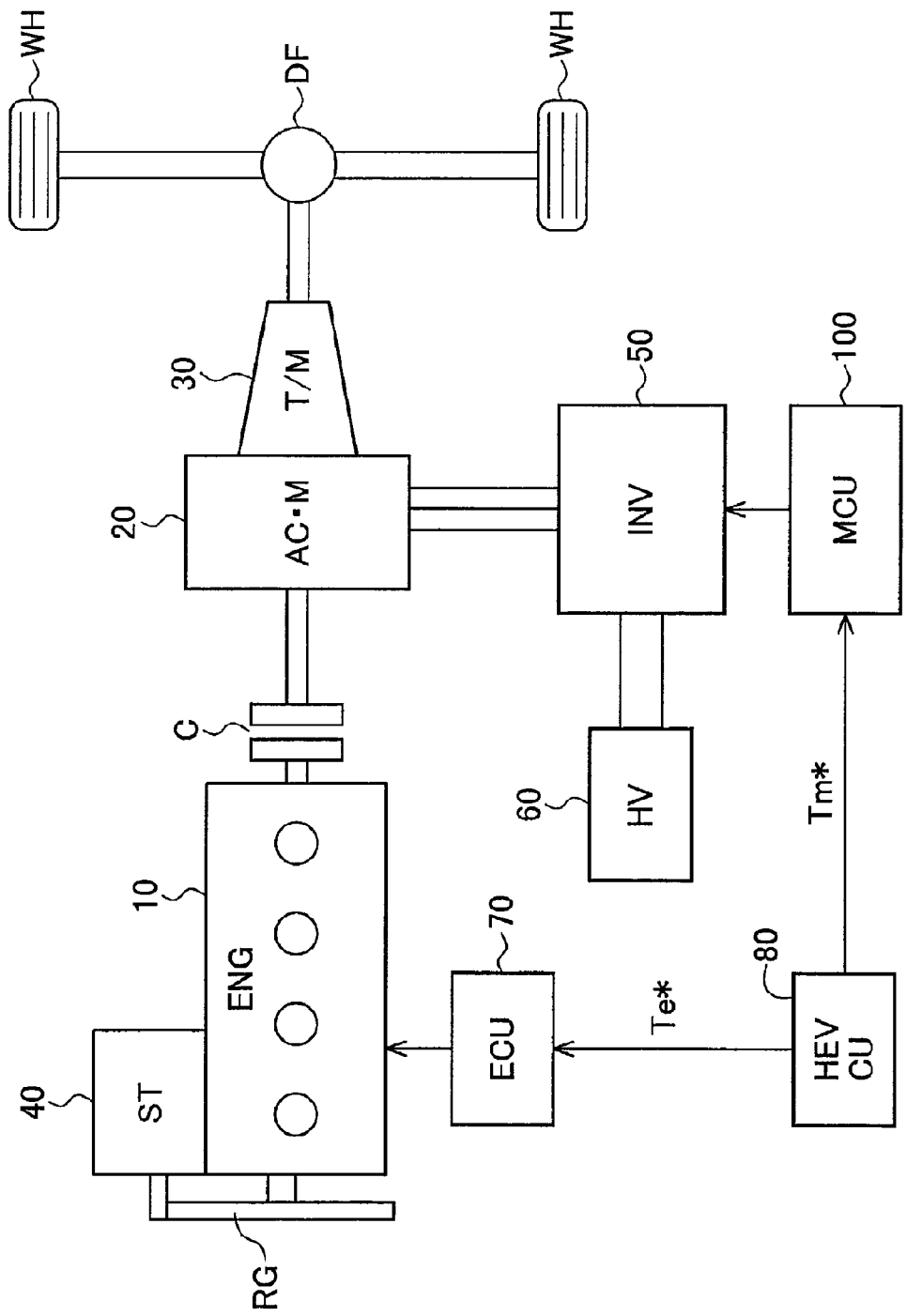
FIG. 1 is a system block diagram illustrating the configuration of a hybrid vehicle in which a motor control apparatus according to a first embodiment of the present invention is mounted.

FIG. 1 is a system block diagram illustrating the configuration of the hybrid vehicle in which the motor control apparatus according to the first embodiment is mounted.

The hybrid vehicle shown in the figure includes an engine (ENG) 10 and a 3-phase synchronous motor (M) 20 as driving force sources. The motor 20 is a 3-phase AC motor. A clutch C is provided between the engine 10 and motor 20. The driving force of the engine 10 or motor 20 is subjected to a transmission gear ratio change by a transmission (T/M) 30, divided by a differential DF for distribution to two shafts, and transmitted to wheels WH to drive the wheels WH.

Further, the engine 10 is provided with a starter (ST) 40, which can start the engine 10 through a ring gear RG as is the case with conventional vehicles.

A battery (HV) 60 is provided as a source of power for the motor 20. For example, a high-voltage (300 V) DC battery is provided as the battery 60. The output of the battery 60 enters an inverter (INV) 50. The inverter 50 converts the input DC power to AC power and supplies the AC power to the motor 20.

The driving force of the motor 20 is controlled by a motor control unit (MCU) 100. The motor control unit 100 varies the output torque of the motor 20 by PWM-driving a switching element in the inverter 50 to vary the current flowing to a stator coil of the motor 20.

An engine control unit (ECU) 70 controls the driving force of the engine 10 by regulating, for instance, the amount of air taken into the engine 10 and the amount of fuel supplied to the engine 10.

A hybrid vehicle control unit (HEV CU) 80 is a control unit that is placed on a higher level than the engine control unit 70 and motor control unit 100. The hybrid vehicle control unit 80 calculates a necessary torque (requested torque) in accordance, for instance, with the amount of accelerator pedal depression by the driver (accelerator opening). Then, the hybrid vehicle control unit 80 allocates the requested torque between the engine 10 and the motor 20 in accordance with the prevailing operating state of the hybrid vehicle, and outputs an engine torque command Te* and a motor torque command Tm* to the engine control unit 70 and the motor control unit 100, respectively. In accordance with the torque command from the hybrid vehicle control unit 80, the engine control unit 70 controls the intake air amount and fuel injection amount so as to output the allocated torque. In accordance with the torque command from the hybrid vehicle control unit 80, the motor control unit 100 controls the inverter 50 to regulate the stator current of the motor 20 in such a manner as to output the allocated torque, and if necessary, controls the field current to be supplied to a field coil of the motor 50.

A typical operation of the hybrid vehicle used in the present embodiment will now be described.

When, for instance, the vehicle is about to start moving, the starter 40 starts the engine 10 to perform idling. The clutch C is disengaged. Next, the inverter 50 controls the driving force of the motor 20 upon torque command input so that the driving force of the motor 20 causes the vehicle to start moving.

When, for instance, a vehicle speed of 40 km/h is reached, the clutch C becomes engaged so that the vehicle runs due to the driving force of the motor 20 and the driving force of the engine 10. Further, when a vehicle speed of 100 km/h is reached, the vehicle runs by using only the driving force of the engine 10.

When the vehicle decelerates, the driving force of the wheels WH is transmitted to the motor 20 to let the motor 20 operate as a generator. The power generated by the generator is converted to DC power by the inverter 50 and stored in the battery 60.

The hybrid vehicle shown in FIG. 1 is a parallel hybrid vehicle. However, the present embodiment can also be applied to a series hybrid vehicle and a series/parallel hybrid vehicle, which is a combination of parallel and series hybrid vehicles. Further, since the present embodiment relates to a motor control apparatus, it is also applicable to an electric vehicle that uses only a motor as a driving force source.

Figure 2:
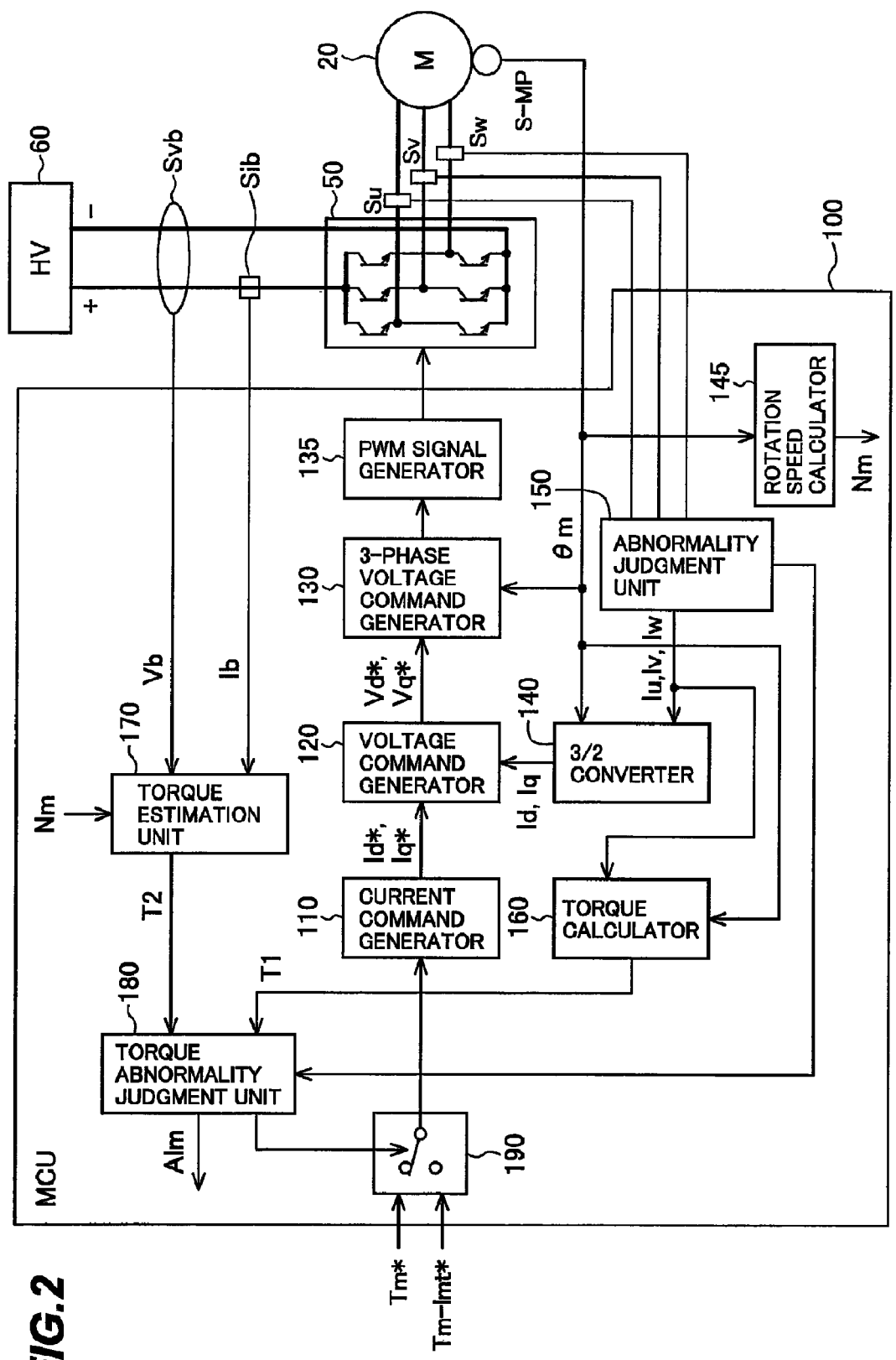
FIG. 2 is a block diagram illustrating the configuration of the motor control apparatus according to the first embodiment of the present invention.

The configuration of the motor control apparatus according to the present embodiment will now be described with reference to FIG. 2. FIG. 2 is a block diagram illustrating the configuration of the motor control apparatus according to the first embodiment of the present invention.

A high DC voltage stored in the battery 60 is converted to a 3-phase AC voltage by the inverter 50, and supplied to the 3-phase synchronous motor 20. The motor generates a driving torque and rotates.

The inverter 50 includes six IGBTs or other semiconductor switching elements. Two IGBTs are series-connected to constitute a U-phase upper arm and a U-phase lower arm. Another two IGBTs are series-connected to constitute a V-phase upper arm and a V-phase lower arm. The remaining two IGBTs are series-connected to constitute a W-phase upper arm and a W-phase lower arm. It should be noted that MOSFETs may also be used as the semiconductor switching elements.

A U-phase current sensor Su, a V-phase current sensor Sv, and a W-phase current sensor Sw are provided to measure the three phase currents of the motor 20.

The motor control unit (MCU) 100 includes an abnormality judgment unit 150, a torque calculator 160, a torque estimation unit 170, a torque abnormality judgment unit 180, and a torque command switching unit 190 in addition to a current command generator 110, a voltage command generator 120, a 3-phase voltage command generator 130, a PWM signal generator 135, a 3/2 converter 140, and a rotation speed calculator 145.

First of all, basic motor control methods used by the current command generator 110, voltage command generator 120, 3-phase voltage command generator 130, PWM signal generator 135, and 3/2 converter 140 will be described. The following description assumes that the torque command switching unit 190 selects a motor torque command Tm* that is output from the hybrid vehicle control unit 80, and transfers it out to the current command generator 110. When no abnormality is detected by the abnormality judgment unit 150, the torque command switching unit 190 outputs individual phase currents Iu, Iv, Iw detected by the current sensors Su, Sv, Sw as they are.

The current command generator 110 outputs a d-axis current command Id* and a q-axis current command Iq* in accordance with an input motor torque command Tm*. The voltage command generator 120 outputs a d-axis voltage Vd and a q-axis voltage Vq in accordance with the d-axis current command Id* and q-axis current command Iq* input from the current command generator 110 and with a d-axis current Id and q-axis current Iq that are actually flowing and output from the 3/2 converter 140. The 3-phase voltage command generator 130 converts the d-axis voltage Vd and q-axis voltage Vq, which are input from the voltage command generator 120, to 3-phase voltage commands Vu, Vv, Vw in accordance with a motor phase angle (magnetic pole position) θm, which is detected by a motor phase angle sensor S-MP, and then outputs the 3-phase voltage commands Vu, Vv, Vw. The PWM signal generator 135 regards the 3-phase voltage commands Vu, Vv, Vw as control signals (PWM signals), inputs them to the gate terminals of the six IGBTs in the inverter 50, and provides on/off control of the IGBTs to control the stator current to be supplied to a 3-phase stator coil of the motor 20.

The 3/2 converter 140 converts the individual phase currents Iu, Iv, Iw detected by the current sensors Su, Sv, Sw to a d-axis current Id and a q-axis current Iq in accordance with the motor phase angle (magnetic pole position) θm detected by the motor phase angle sensor S-MP, and then outputs the d-axis current Id and q-axis current Iq. For example, a resolver sensor is used as the motor phase angle sensor S-MP.

The rotation speed calculator 145 uses the motor phase angle (magnetic pole position) θm, which is output from the motor phase angle sensor S-MP, to calculate a motor rotation speed N from the amount of change over a fixed period of time.

As described above, to ensure that the driving torque of the motor 20 complies with the motor torque command, the motor control unit 100 controls the stator current flowing to the motor 20, as described above, so that the actually flowing d-axis current Id and q-axis current Iq comply with the d-axis current command Id* and q-axis current command Iq*.

The abnormality judgment unit 150 examines individual phase currents Iu, Iv, Iw detected by the current sensors Su, Sv, Sw, and judges whether one of the three current sensors Su, Sv, Sw is abnormal. When a current sensor is found abnormal, the abnormality judgment unit 150 calculates the current in the phase in which the abnormal current sensor is positioned. The abnormality judgment unit 150 then outputs the two normal phase currents and the calculated phase current to the 3/2 converter 140. When all the three current sensors Su, Sv, Sw are judged to be normal, the abnormality judgment unit 150 outputs the individual phase currents Iu, Iv, Iw to the 3/2 converter 140 as they are. The abnormality judgment unit 150 will be described in detail later with reference to FIG. 3.

The torque calculator 160 calculates an estimated torque T1, which is output from the motor 20 in accordance with the three phase currents Iu, Iv, Iw output from the abnormality judgment unit 150 and the motor phase angle (magnetic pole position) θm detected by the motor phase angle sensor S-MP, and outputs the calculated value to the torque abnormality judgment unit 180.

The torque estimation unit 170 inputs a battery voltage Vb detected by a voltage detector Svb, which detects a DC voltage supplied from the battery 60 to the inverter 50, and a battery current Ib detected by a current detector Sib, which detects a DC current. Since the torque estimation unit 170 can calculate inverter input power in accordance with the input battery voltage Vb and battery current Ib, it estimates the torque to be output from the motor 20, and outputs an estimated torque T2 to the torque abnormality judgment unit 180.

When a current sensor abnormality is detected by the abnormality judgment unit 150, the torque abnormality judgment unit 180 examines the estimated torque T1, which is calculated by the torque calculator 160, and the estimated torque T2, which is estimated by the torque estimation unit 170, to check for a torque abnormality. If any torque abnormality is detected, the torque abnormality judgment unit 180 outputs an alarm to the outside and stops the control operation of the motor control unit 100. Even when no torque abnormality is detected, the torque abnormality judgment unit 180 outputs a switching command to the torque command switching unit 190 because a current sensor abnormality is detected by the abnormality judgment unit 150. In accordance with the switching command, the torque command switching unit 190 performs a switching operation so that a limited torque command Tm-lmt* enters the current command generator 110.

When the limited torque command Tm-lmt* enters the current command generator 110, the maximum torque value to be output from the motor 20 is limited to a limit value specified by the limited torque command Tm-lmt*. Therefore, the torque to be output from the motor 20 is lower than for a normal run. When the output of the motor 20 is limited, the maximum speed at which the motor 20 alone can move the vehicle is limited, for instance, to 20 km/h or so. However, since the motor 20 is still able to run the vehicle, the vehicle can travel, for instance, to a nearby repair shop in limp home mode.

A judgment process performed by the abnormality judgment unit 150 used in the motor control apparatus according to the present embodiment will now be described with reference to FIGS. 3 and 4.

Figure 3:
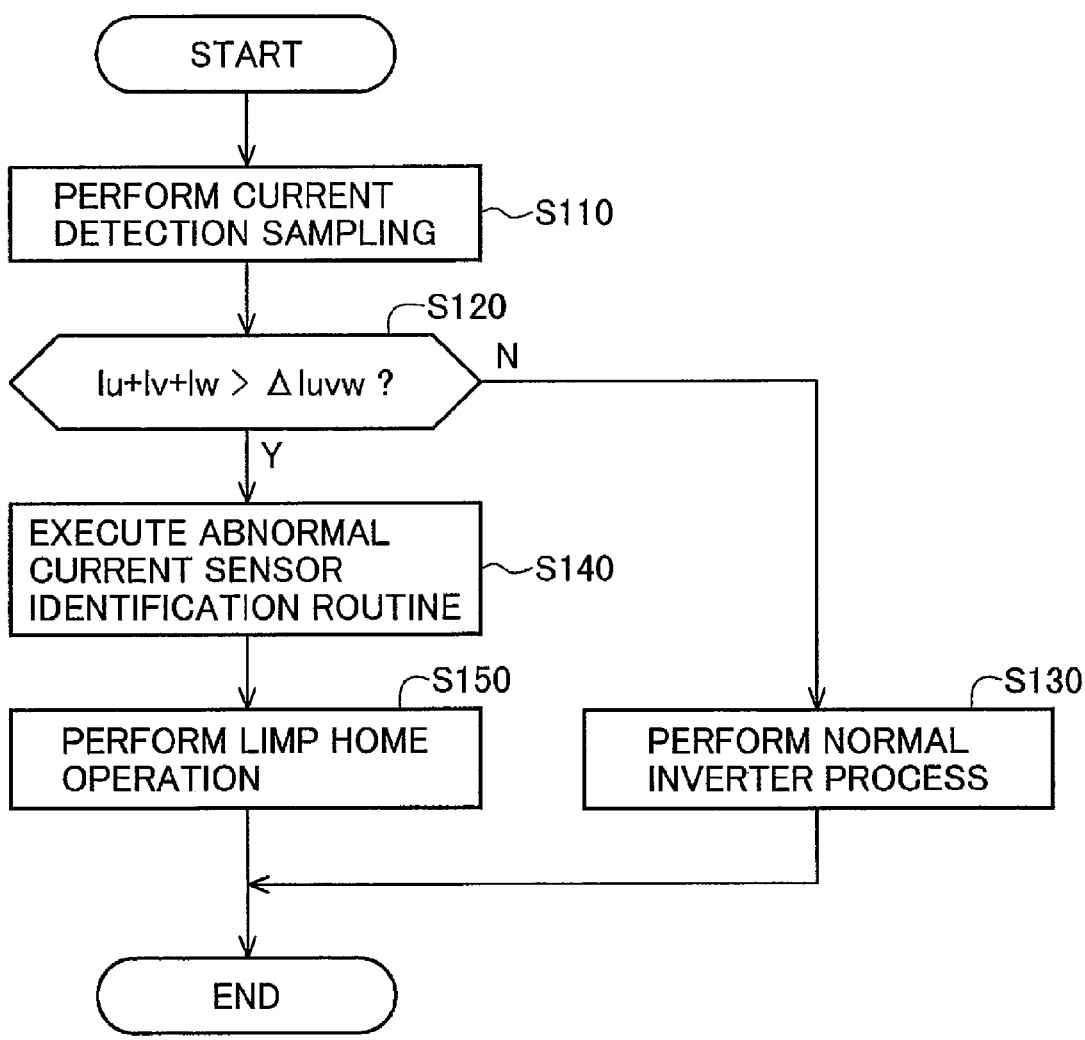
FIG. 3 is a flowchart illustrating a judgment process that is performed by an abnormality judgment unit used in the motor control apparatus according to the first embodiment of the present invention.

FIG. 3 is a flowchart illustrating a judgment process that is performed by the abnormality judgment unit used in the motor control apparatus according to the first embodiment of the present invention. FIG. 4 is a flowchart illustrating a current calculation process that is performed by the abnormality judgment unit used in the motor control apparatus according to the first embodiment of the present invention.

In step S100, which is shown in FIG. 3, the abnormality judgment unit 150 makes measurements by sampling the three current values Iu, Iv, Iw at intervals synchronized with the switching frequency of IGBTs constituting the inverter 50. When the influence, for instance, of torque abnormality occurrence time in the event of an abnormality is considered, however, synchronization with the above switching frequency need not always be achieved.

Next, step S110 is performed to judge whether the sum of the three current values Iu, Iv, Iw is greater than a predetermined value ΔIuvw. When all the three current sensors Su, Sv, Sw are normal, the sum of the current values Iu, Iv, Iw is always zero and therefore smaller than the predetermined value ΔIuvw. If a certain sensor fails to indicate a correct current due to its abnormality, the sum is not equal to zero.

When the sum of the three current values Iu, Iv, Iw is smaller than the predetermined value ΔIuvw, all the three current sensors Su, Sv, Sw are normal. Therefore, processing proceeds to step S130, in which a normal inverter process is continuously performed.

When, on the other hand, the sum of the three current values Iu, Iv, Iw is greater than the predetermined value □Iuvw, one or more of the three current sensors Su, Sv, Sw are abnormal. In this instance, therefore, processing proceeds to step S140, in which an abnormal current sensor identification routine is executed.

The abnormal current sensor identification routine, which is executed in step S140 as shown in FIG. 3, will now be described with reference to FIG. 4.

The abnormal current sensor identification routine identifies an abnormal sensor, calculates the phase current to be detected by the abnormal sensor, and continuously provides motor control. When, for instance, the U-phase current sensor is abnormal, the U-phase current Iu can be calculated from the V-phase current Iv and W-phase current Iw as indicated below:

$$Iu = -Iv - Iw$$

The V-phase current Iv and W-phase current Iw, which are detected by normal current sensors, and the calculated U-phase current Iu are then output to the 3/2 converter 140 shown in FIG. 2. When one of the three current sensors is abnormal, the calculated value is used to provide control so as to perform a limp home operation.

Under normal conditions, the sum of the current sensor outputs Iu, Iv, Iw is zero. Therefore, when Iu=0 as mentioned earlier, Iv=−Iw. This relationship is used in step S140 (abnormal current sensor identification routine) to identify an abnormal current sensor.

Figure 4:
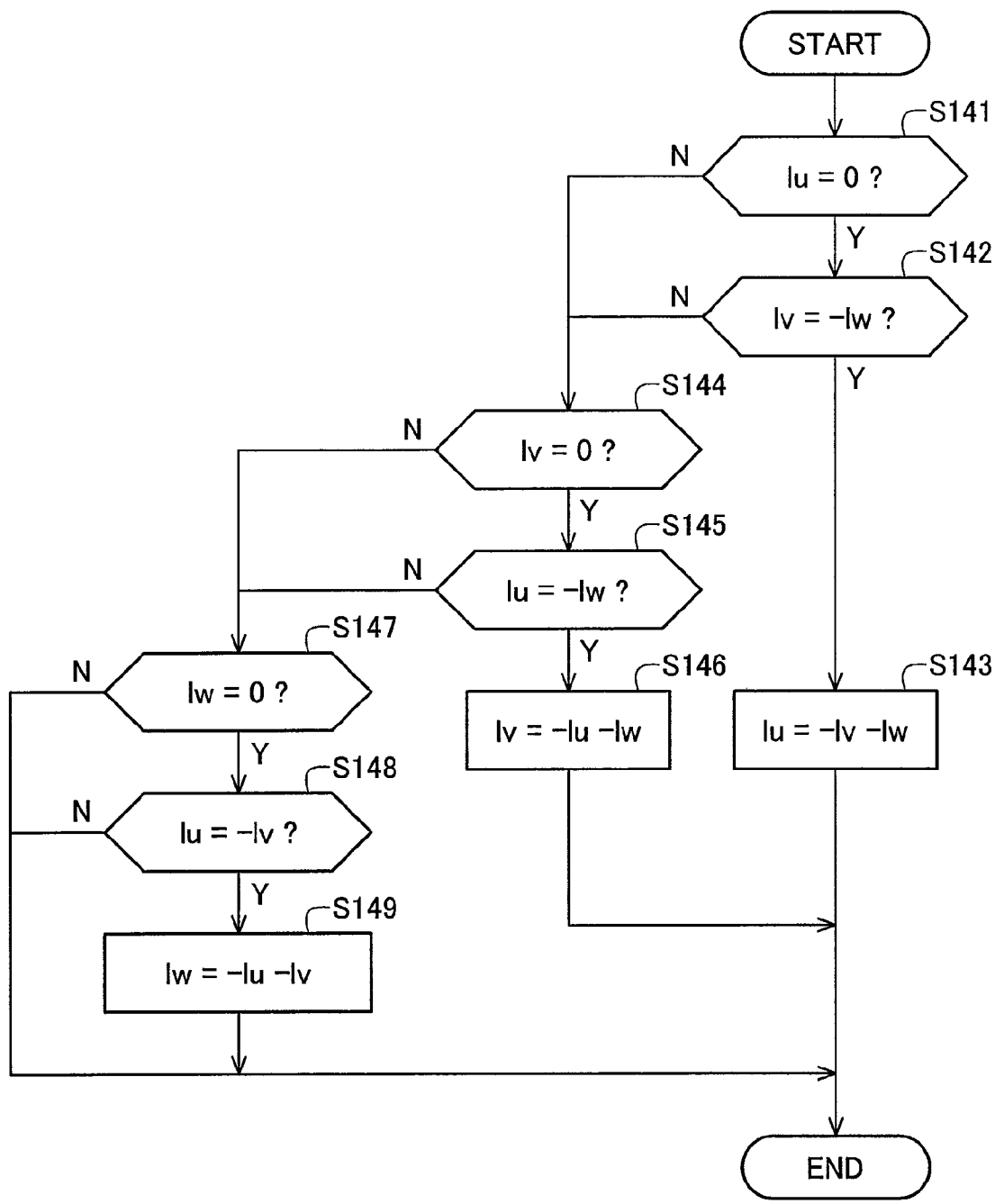
FIG. 4 is a flowchart illustrating a current calculation process that is performed by the abnormality judgment unit used in the motor control apparatus according to the first embodiment of the present invention.

In step S141, which is shown in FIG. 4, the abnormality judgment unit 150 judges whether the U-phase current Iu is 0 (zero). If the U-phase current Iu is 0, the other phase currents are checked in step S142 to judge whether Iv=−Iw. If Iv=−Iw, it can be judged that the U-phase current Iu is abnormal. Therefore, step S143 is performed to calculate the U-phase current Iu from the V-phase current Iv and W-phase current Iw in accordance with the equation Iu=−Iv−Iw.

If the query in step S141 or S142 is answered "No," the abnormality judgment unit 150 performs step S144 to judge whether the V-phase current Iv is 0. If the V-phase current Iv is 0, step S145 is performed to check the other phase currents and judge whether Iu=−Iw. If Iu=−Iw, it can be judged that the V-phase current Iv is abnormal, step S146 is performed to calculate the V-phase current Iv from the U-phase current Iu and W-phase current Iw in accordance with the equation Iv=−Iu−Iw.

Further, if the query in step S144 or S145 is answered "No," the abnormality judgment unit 150 performs step S147 to judge whether the W-phase current Iw is 0. If the W-phase current Iw is 0, step S148 is performed to check the other phase currents and judge whether Iu=−Iv. If Iu=−Iv, it can be judged that the W-phase current Iw is abnormal. Therefore, step S149 is performed to calculate the W-phase current Iw from the U-phase current Iu and V-phase current Iv in accordance with the equation Iw=−Iu−Iv.

When step S140, which is shown in FIG. 3, is completed to identify an abnormal sensor and calculate the current in the phase of the abnormal sensor, step S150, which is shown in FIG. 3, is performed to execute a limp home operation routine.

A process performed by the torque calculator 160, torque estimation unit 170, and torque abnormality judgment unit 180 used in the motor control apparatus according to the present embodiment will now be described with reference to FIG. 5.

Figure 5:
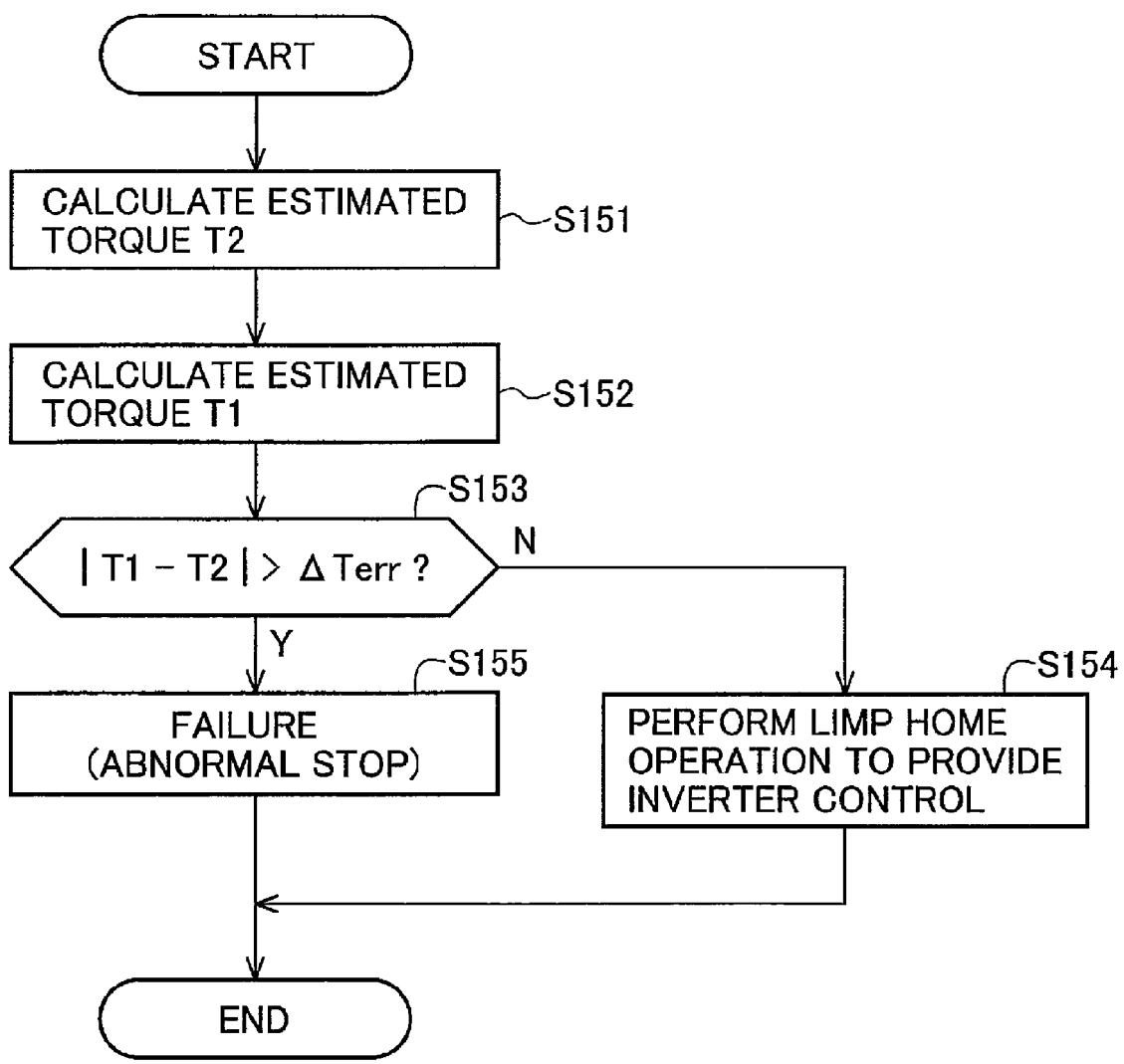
FIG. 5 is a flowchart illustrating a process that is performed by a torque calculator, a torque estimation unit, and a torque abnormality judgment unit used in the motor control apparatus according to the first embodiment of the present invention.

FIG. 5 is a flowchart illustrating a process that is performed by the torque calculator, torque estimation unit, and torque abnormality judgment unit used in the motor control apparatus according to the first embodiment of the present invention.

Even when a motor current sensor is found abnormal, the remaining normal current sensors can be used to continuously provide control. However, if another current sensor becomes faulty, proper motor control may not be provided. Therefore, when a current sensor becomes abnormal, the mode of control is changed to perform a limp home operation. Further, if another current sensor becomes abnormal, it is necessary to stop exercising control.

In step S151, which is shown in FIG. 5, the torque estimation unit 170 shown in FIG. 2 calculates the estimated torque T2 from inverter input voltage (Vb) and current (Ib) in accordance with inverter input side information, that is, DC information. The estimated torque T2 can be calculated from the following equation:

$$Tm\text{-}Pr = Vb \times Ib \times \eta I \times \eta M / N$$

where $\eta I$ is inverter efficiency, $\eta M$ is motor efficiency, and N is a motor rotation speed. Input power (Pb) is calculated from the inverter input voltage (Vb) and current (Ib).

The input voltage (Vb) is detected by a battery voltage sensor Svb. The input current (Ib) is detected by a battery current sensor Sib. The inverter efficiency $\eta I$ and motor efficiency $\eta M$ are stored beforehand as inverter and motor constants.

Next, step S152 is performed. In step S152, the torque calculator 160 calculates the estimated torque T1 from the following equation:

$$Tm\text{-}r1 = 3 \times P \times (\phi \times Iq \times (Ld-Lq) \times Id \times Iq)$$

where P is a pole number, $\phi$ is a flux, Iq is a q-axis current, Id is a d-axis current, Ld is d-axis inductance, and Lq is q-axis inductance.

The d-axis current Id and q-axis current Iq in the above equation can be calculated from the individual phase currents Iu, Iv, Iw and the phase $\theta m$ of the motor phase angle sensor S-MP. The other numerical values are predetermined by a motor constant. Therefore, the estimated torque T1 can be obtained by detecting the d-axis current Id and q-axis current Iq.

Next, step S153 is performed. In step S153, the torque abnormality judgment unit 180 compares the estimated torque T1 and estimated torque T2, and judges whether the difference between these two torque values is greater than an abnormality detection value $\Delta terr$.

If the difference is not greater than the abnormality detection value $\Delta terr$, it can be judged that only one sensor is abnormal. Therefore, processing proceeds to step S154, in which a limp home operation is performed to provide inverter control. In other words, the torque abnormality judgment unit 180 outputs a switching command to the torque command switching unit 190 as shown in FIG. 2. In accordance with the switching command, the torque command switching unit 190 performs a switching operation so that the limited torque command Tm-lmt* enters the current command generator 110.

If the difference is greater than the abnormality detection value $\Delta terr$, it is judged that two or more sensors are abnormal. In this instance, step S155 is performed to output an alarm and stop exercising motor control.

Even if an additional sensor failure occurs during a limp home operation that is continuously performed while one sensor is abnormal, such an additional sensor failure can be detected as far as the steps described above are followed. This makes it possible to obtain a highly reliable controller.

As described above, the present embodiment can reduce the current sensor cost because it can detect a current sensor abnormality by using three current sensors.

Further, even when one current sensor becomes abnormal, the present embodiment can continue with a limp home operation by calculating the current in an abnormal phase in accordance with the outputs from the remaining two current sensors.

Furthermore, even if two or more current sensors become faulty during a limp home operation, the present embodiment can detect such a failure and immediately stop exercising control. Therefore, it is possible to obtain a highly reliable controller.

The configuration and operation of a motor control apparatus according to a second embodiment of the present invention will now be described with reference to FIGS. 6 and 7. The configuration of a hybrid vehicle in which the motor control apparatus according to the second embodiment is mounted is the same as shown in FIG. 1.

First of all, the configuration of the motor control apparatus according to the present embodiment will be described with reference to FIG. 6.

Figure 6:
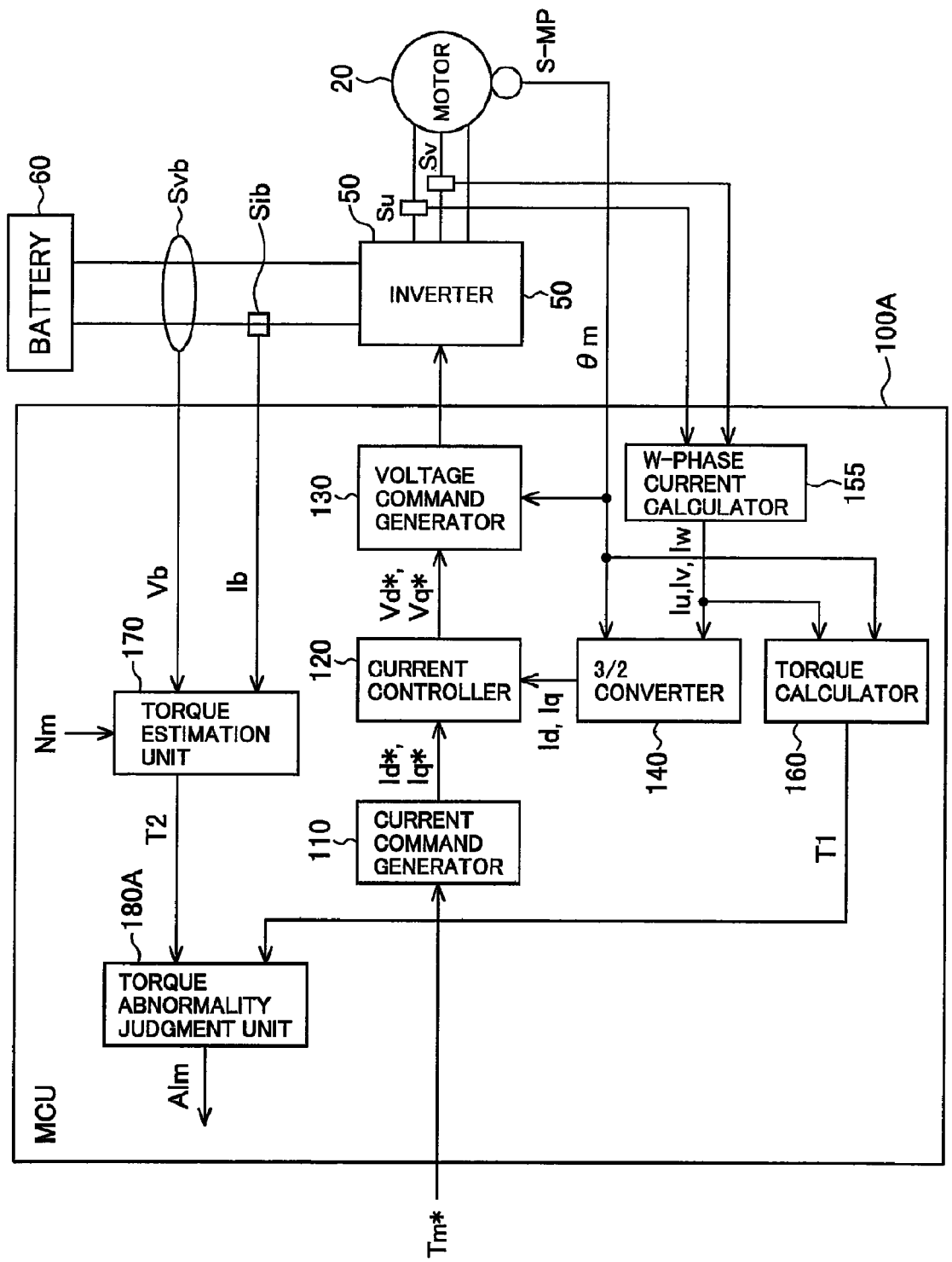
FIG. 6 is a block diagram illustrating the configuration of a motor control apparatus according to a second embodiment of the present invention.

FIG. 6 is a block diagram illustrating the configuration of the motor control apparatus according to the second embodiment of the present invention. Like elements in FIGS. 2 and 6 are designated by the same reference numerals.

The example shown in FIG. 2 indicates that the U-phase, V-phase, and W-phase current sensors Su, Sv, Sw are provided to measure the three phase currents of the motor 20. However, the present embodiment is provided with two current sensors, namely, the U-phase current sensor Su and V-phase current sensor Sv.

Further, the present embodiment is provided with a motor control unit (MCU) 100A, which differs from the motor control unit (MCU) 100 shown in FIG. 2. The difference between these two motor control units is described below. The motor control unit 100A does not include the abnormality judgment unit 150 and torque command switching unit 190, which are shown in FIG. 2. Instead, the motor control unit 100A includes a W-phase current calculator 155. Moreover, the process performed by a torque abnormality judgment unit 180A, which is included in the present embodiment, is slightly different from the process performed by the torque abnormality judgment unit 180 shown in FIG. 2. The present embodiment also includes the PWM signal generator 135, 3/2 converter 140, and rotation speed calculator 145 shown in FIG. 2. However, these sections are not shown in FIG. 6.

The W-phase current calculator 155 calculates the W-phase current Iw from the U-phase current Iu and V-phase current Iv, which are detected by the U- and V-phase current sensors Su, Sv, in accordance with the equation Iw=−Iu−Iv.

A process performed by the torque calculator 160, torque estimation unit 170, and torque abnormality judgment unit 180A used in the motor control apparatus according to the present embodiment will now be described with reference to FIG. 7.

Figure 7:
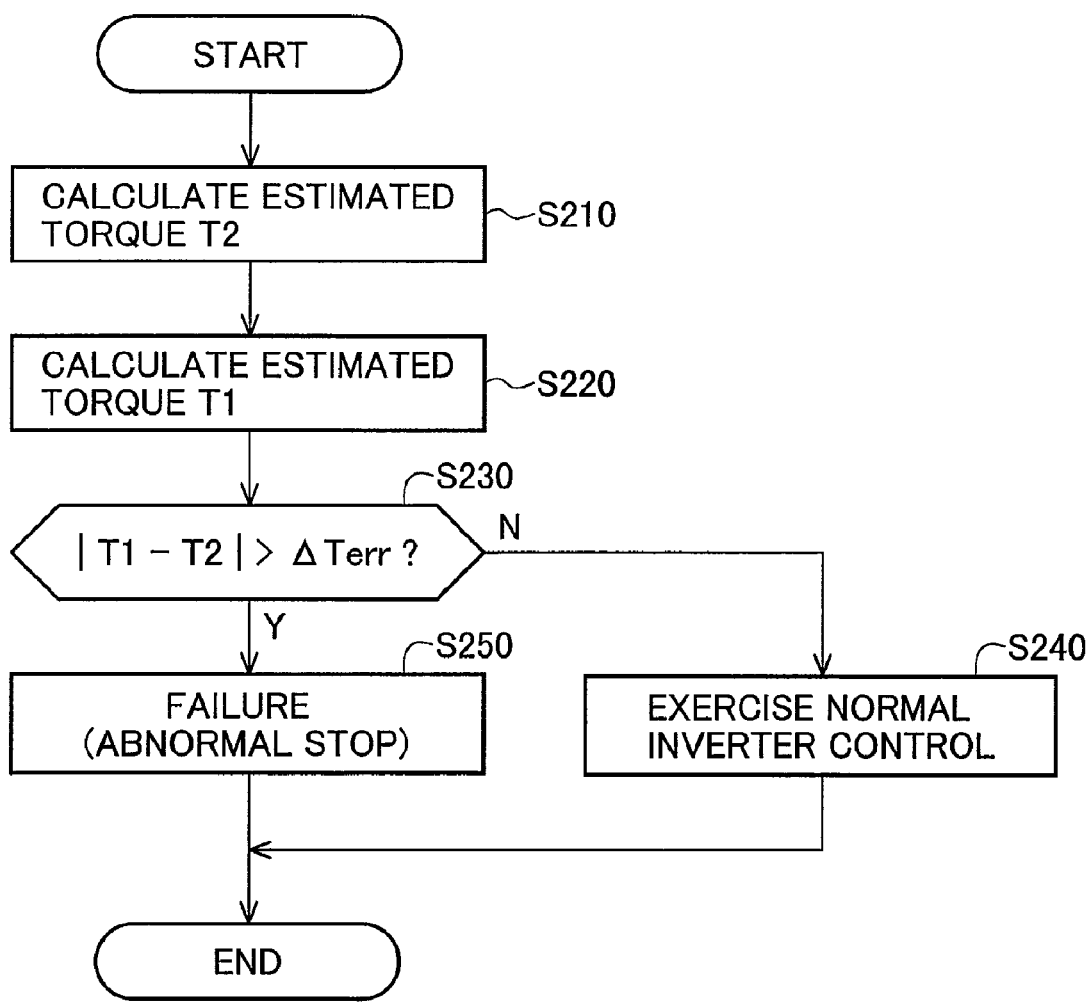
FIG. 7 is a flowchart illustrating a process that is performed by a torque calculator, a torque estimation unit, and a torque abnormality judgment unit used in the motor control apparatus according to the second embodiment of the present invention.

FIG. 7 is a flowchart illustrating a process that is performed by the torque calculator, torque estimation unit, and torque abnormality judgment unit used in the motor control apparatus according to the second embodiment of the present invention.

In step S210, which is shown in FIG. 7, the torque estimation unit 170 shown in FIG. 6 calculates the estimated torque T2 from inverter input voltage (Vb) and current (Ib) in accordance with inverter input side information, that is, DC information, as is the case with step S151, which is shown in FIG. 5. The estimated torque T2 can be calculated from the following equation:

$$Tm\text{-}Pr = Vb \times Ib \times \eta I \times \eta M / N$$

where $\eta I$ is inverter efficiency, $\eta M$ is motor efficiency, and N is a motor rotation speed. Input power (Pb) is calculated from the inverter input voltage (Vb) and current (Ib).

The input voltage (Vb) is detected by the battery voltage sensor Svb. The input current (Ib) is detected by the battery current sensor Sib. The inverter efficiency $\eta I$ and motor efficiency $\eta M$ are stored beforehand as inverter and motor constants. The motor rotation speed N can be easily determined from the amount of change over a fixed period of time through the use of a signal of the motor phase angle sensor S-MP.

Next, step S220 is performed. In step S220, the torque calculator 160 calculates the estimated torque T1 from the following equation as is the case with step S152, which is shown in FIG. 5:

$$Tm\text{-}r1 = 3 \times P \times (\phi \times Iq \times (Ld-Lq) \times Id \times Iq)$$

where P is a pole number, $\phi$ is a flux, Iq is a q-axis current, Id is a d-axis current, Ld is d-axis inductance, and Lq is q-axis inductance.

The d-axis current Id and q-axis current Iq in the above equation can be calculated from the individual phase currents Iu, Iv, Iw and the phase $\theta m$ of the motor phase angle sensor S-MP. The other numerical values are predetermined by a motor constant. Therefore, the estimated torque T1 can be obtained by detecting the d-axis current Id and q-axis current Iq.

Next, step S230 is performed. In step S230, the torque abnormality judgment unit 180A compares the estimated torque T1 and estimated torque T2, and judges whether the difference between these two torque values is greater than the abnormality detection value $\Delta terr$, as is the case with step S153, which is shown in FIG. 5.

If the difference is not greater than the abnormality detection value $\Delta terr$, it can be judged that the two sensors Su, Sv and the inverter 50 are normal. Therefore, processing proceeds to step S240, in which normal inverter control is exercised.

If, on the other hand, the difference is greater than the abnormality detection value $\Delta terr$, it is judged that either of the two sensors Su, Sv or the inverter 50 is abnormal. In this instance, step S250 is performed to output an alarm and stop exercising motor control.

If the judgment result obtained in step S230, in which the torque abnormality judgment unit 180A compares the estimated torque T1 and estimated torque T2, indicates that the difference between these two torque values is greater than the abnormality detection value $\Delta terr$, it is conceivable that either of the two sensors Su, Sv, the inverter 05, the battery voltage sensor Svb, or the battery current sensor Sib may be abnormal. However, an abnormal item still cannot be identified. In general, however, the battery voltage sensor Svb and battery current sensor Sib are relatively unlikely to become abnormal because they detect a DC voltage or current. It is therefore probable that either of the two AC current sensors Su, Sv or the semiconductor switching element or other part of the inverter 50 may be abnormal. In any case, the current process comes to a stop because a normal inverter process cannot be performed when such an abnormality is detected.

Performing the above process makes it possible to conduct an operation with two motor current sensors and detect motor current sensor abnormalities. Consequently, cost reduction can be achieved.

The configuration of an electric four-wheel drive vehicle in which the motor control apparatus according to either of the foregoing embodiments of the present invention is mounted will now be described with reference to FIG. 8.

Figure 8:
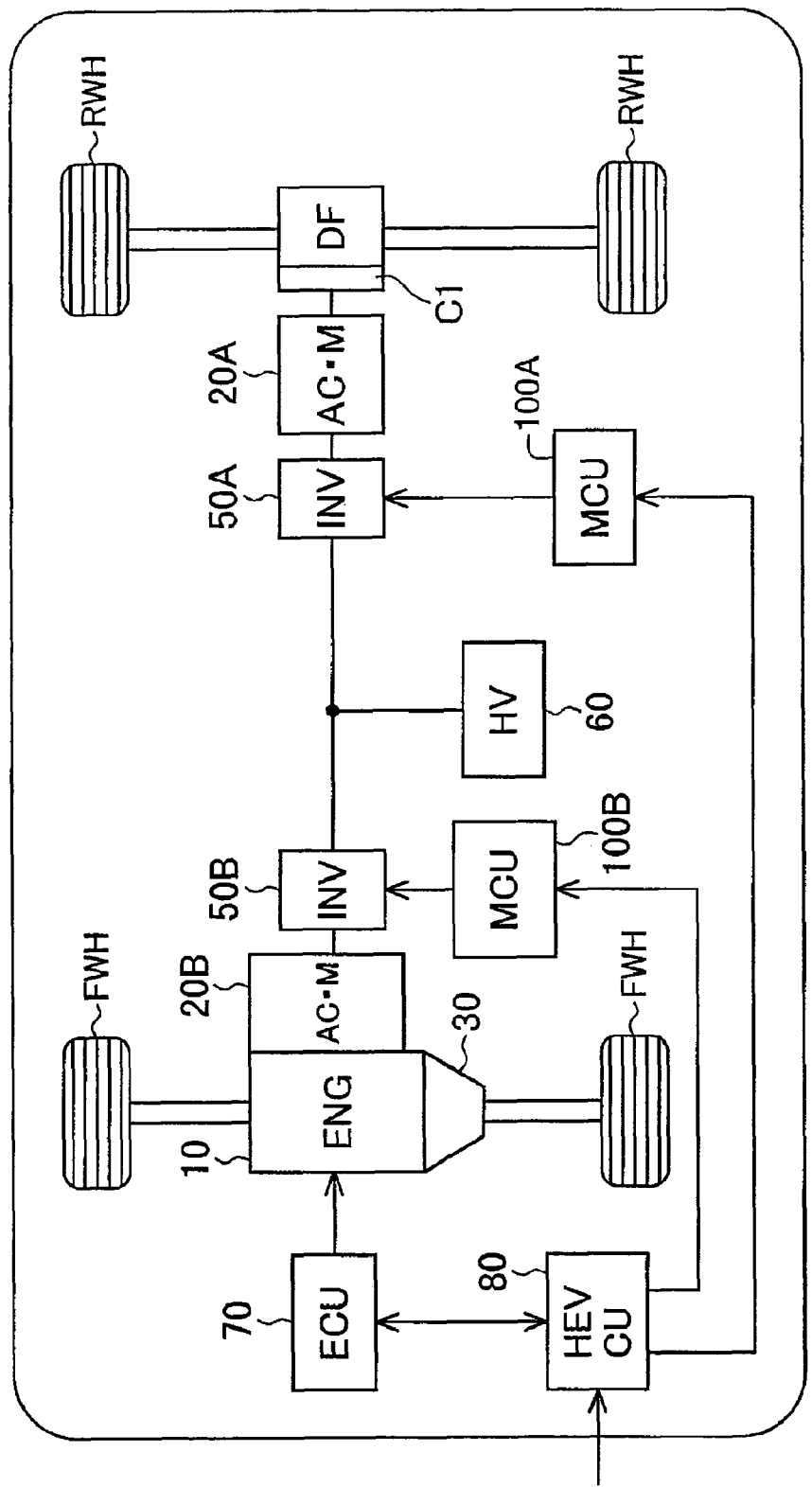
FIG. 8 is a system block diagram illustrating the configuration of an electric four-wheel drive vehicle in which the motor control apparatus according to either of the embodiments of the present invention is mounted.

FIG. 8 is a system block diagram illustrating the configuration of an electric four-wheel drive vehicle in which the motor control apparatus according to either of the foregoing embodiments of the present invention is mounted.

The electric four-wheel drive vehicle includes an engine 10, an AC motor 20B, a rear wheel drive AC motor 10A, and a high-voltage battery 60. The driving forces of the engine 10 and AC motor 20B are transmitted to front wheels FWH through a transmission 30 to drive the front wheels FWH. The output of the engine 10 is controlled in accordance with a command from an engine control unit (ECU) 70. The output of the engine 10 may not only drive the front wheels FWH but also drive the AC motor 20B. When the AC motor 20B drives the front wheels FWH, it is driven by electrical power stored in the high-voltage battery 60. When the front wheels FWH provide regenerative braking, regenerated energy from the AC motor 20B is supplied to the high-voltage battery 60. When the AC motor 20B generates power, it uses motive power of the engine 10 and outputs AC power as a generator.

An inverter 50B is included to provide motive power control as needed in the AC motor 20B. The inverter 50B converts DC power stored in the high-voltage battery 60 to AC power, and supplies the AC power to the AC motor 20B. When regenerative braking or power generation is to be provided, the inverter 50B converts AC power to DC power and supplies the DC power to the high-voltage battery 60.

An AC motor 20A can provide drive and regeneration. The driving force of the AC motor 20A is transmitted to rear wheels RWH through a clutch C1 and a differential gear DF to drive the rear wheels RWH. When the clutch C1 becomes engaged, the turning force of the AC motor 20A drives the rear wheels RWH. When the clutch C1 becomes disengaged, the AC motor 20A is mechanically separated from the rear wheels RWH so that the rear wheels RWH do not transmit driving force to the road surface.

When braking is to be provided, regeneration torque is obtained from the rear wheels RWH to regenerate the AC motor 20A. Consequently, regenerated energy is obtained.

Further, an inverter 50A is included to provide motive power control as needed in the AC motor 20A. The inverter 50A converts DC power stored in the high-voltage battery 60 to AC power, and supplies the AC power to the AC motor 20A.

An HEV controller 80 is connected to the ECU 70, a motor control apparatus 10B, and a motor control apparatus 100A through a CAN or other means of communication. The HEV controller 80 provides overall control of the entire drive system, for instance, by calculating command values to be transmitted to the front wheel AC motor 20B and rear wheel AC motor 20A.

The motor control apparatus 100B controls the AC motor 20B and inverter 50B in accordance with the engine rotation speed and torque command, which are received from the HEV controller 80. The motor control apparatus 100A controls the AC motor 20A and inverter 50A in accordance with the engine rotation speed and torque command, which are received from the HEV controller 80.

The motor control apparatuses 100A, 100B detect a current sensor failure and other abnormalities as described in conjunction with the embodiments depicted in FIGS. 2 to 5 or FIGS. 6 and 7.

What is claimed is:

1. A motor control apparatus for providing drive control of a 3-phase AC motor, the motor control apparatus comprising:
   a sensor abnormality judgment unit that determines existence of an abnormality of three current sensors that detect individual phase currents of a 3-phase AC current supplied from an inverter to the 3-phase AC motor;
   wherein,
   the sensor abnormality judgment unit determines that one of the three current sensors is abnormal when the sum of the 3-phase AC current is greater than a predetermined value;
   the sensor abnormality judgment unit identifies an abnormal current sensor, which is one of the three current sensors, and calculates the phase current detected by the abnormal current sensor, based on an output from the remaining two normal current sensors, and outputs it;
   the motor control apparatus further comprises
      a torque command value switch unit that switches from a torque command value to a limited torque command value; and
      a torque abnormality judgment unit instructed to switch the torque command value to the torque command value switch unit, based on a comparison between an estimated torque, which is estimated from DC side power of the inverter, and an actual torque, which is determined from the currents detected by the two normal current sensors and the phase current calculated by the sensor abnormality judgment unit;
   the torque abnormality judgment unit is instructed to switch the torque command value to the torque command value switch unit when an abnormal current sensor is detected by the sensor abnormality judgment unit and the difference between the estimated torque and the actual torque is smaller than a predetermined value; and
   the motor control apparatus controls output torque of the 3-phase AC motor in accordance with the limited torque command value.

2. The motor control apparatus according to claim 1, wherein the torque abnormality judgment unit stops the motor control apparatus's control over the 3-phase AC motor when the difference between the estimated torque and the actual torque is greater than a predetermined value.

3. A motor control apparatus for providing drive control of a 3-phase AC motor, the motor control apparatus comprising:
   a phase current calculator that calculates current in one phase of a 3-phase AC current supplied from an inverter to the 3-phase AC motor, based on outputs from two current sensors that sense current in the other two phases of the 3-phase AC current; and
   an abnormality judgment unit that stops the motor control apparatus's control over the 3-phase AC motor based on a comparison between an estimated torque which is estimated from DC side power of the inverter, and an actual torque which is determined from the currents detected by said two current sensors and the phase current calculated by the phase current calculator;
   wherein the abnormality judgment unit stops the motor control apparatus's control over the 3-phase AC motor when the difference between the estimated torque and the actual torque is greater than a predetermined value.

* * * * *